US012635564B2

(12) United States Patent
Arrington et al.

(10) Patent No.: US 12,635,564 B2
(45) Date of Patent: May 19, 2026

(54) LIQUID METAL BASED FIRST LEVEL INTERCONNECTS

(71) Applicant: Intel Corporation, Santa Clara, CA (US)

(72) Inventors: Kyle J. Arrington, Gilbert, AZ (US); Karumbu Nathan Meyyappan, Portland, OR (US); Srikant Nekkanty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 17/856,965

(22) Filed: Jul. 2, 2022

(65) Prior Publication Data

US 2024/0006400 A1 Jan. 4, 2024

(51) Int. Cl.
| | |
|---|---|
| *H01L 25/18* | (2023.01) |
| *H01L 23/00* | (2006.01) |
| *H01L 23/498* | (2006.01) |
| *H01L 23/538* | (2006.01) |

(52) U.S. Cl.
CPC ........ *H01L 25/18* (2013.01); *H01L 23/49811* (2013.01); *H01L 23/5385* (2013.01); *H01L 24/13* (2013.01); *H01L 24/16* (2013.01); *H01L 24/32* (2013.01); *H01L 24/73* (2013.01); *H01L 24/81* (2013.01); *H01L 24/29* (2013.01); *H01L 2224/13105* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13169* (2013.01); *H01L 2224/13184* (2013.01); *H01L 2224/16237* (2013.01); *H01L 2224/2919* (2013.01); *H01L 2224/32225* (2013.01); *H01L 2224/73204* (2013.01); *H01L 2224/81405* (2013.01); *H01L 2224/81409* (2013.01); *H01L 2224/81411* (2013.01);

(Continued)

(58) Field of Classification Search
CPC .............. H01L 25/18; H01L 23/49811; H01L 23/5385; H01L 24/13; H01L 24/16; H01L 24/32; H01L 24/73; H01L 24/81; H01L 24/29; H01L 2224/16237; H01L 2224/2919; H01L 2224/32225; H01L 2224/73204; H01L 2924/0665; H01L 23/49866; H01L 23/5384; H01L 25/0652; H01L 25/50; H01L 2225/06513; H01L 2225/06517; H01L 2225/06589; H01L 25/0655; H01L 24/83
See application file for complete search history.

(56) References Cited

U.S. PATENT DOCUMENTS

| | | | |
|---|---|---|---|
| 11,557,579 B2 * | 1/2023 | Zhang | H01L 23/5386 |
| 12,244,083 B2 * | 3/2025 | Harako | H01R 12/52 |

(Continued)

*Primary Examiner* — Douglas W Owens
(74) *Attorney, Agent, or Firm* — Alliance IP, LLC

(57) ABSTRACT

In one embodiment, an integrated circuit assembly includes a substrate comprising electrical connectors on a top side of the substrate and an integrated circuit die coupled to the top side of the substrate. The integrated circuit die includes metal pillars extending from a bottom side of the die facing the top side of the substrate, and the metal pillars of the integrated circuit die are electrically connected to the electrical connectors of the substrate via a liquid metal (e.g., a Gallium-based alloy).

25 Claims, 9 Drawing Sheets

(52) U.S. Cl.

CPC ............... *H01L 2224/81418* (2013.01); *H01L 2924/01008* (2013.01); *H01L 2924/0665* (2013.01)

(56) References Cited

U.S. PATENT DOCUMENTS

| | | | |
|---|---|---|---|
| 2023/0197594 A1* | 6/2023 | Meyyappan | ...... H01L 23/49811 |
| | | | 257/737 |
| 2023/0197622 A1* | 6/2023 | Meyyappan | ........ H01L 23/5384 |
| | | | 257/737 |
| 2023/0299024 A1* | 9/2023 | Wu | .................. H01L 23/49866 |
| | | | 257/737 |
| 2023/0395480 A1* | 12/2023 | Chuah | .................... H05K 3/368 |

\* cited by examiner

600

602

602

<u>900</u>

PROCESSOR UNIT
<u>902</u>

COMMUNICATION COMPONENT
<u>912</u>

MEMORY
<u>904</u>

BATTERY/POWER
<u>914</u>

DISPLAY DEVICE
<u>906</u>

GNSS DEVICE
<u>918</u>

AUDIO OUTPUT DEVICE
<u>908</u>

AUDIO INPUT DEVICE
<u>924</u>

AN OTHER OUTPUT DEVICE
<u>910</u>

AN OTHER INPUT DEVICE
<u>920</u>

ANTENNA <u>922</u>

LIQUID METAL BASED FIRST LEVEL INTERCONNECTS

BACKGROUND

First level interconnects (FLIs), which may also be referred to as die-level interconnects, typically utilize solder (e.g., tin silver copper (SAC) solder) for attaching a die to a substrate or a die to another die. However, using solder requires high temperatures and fluxes, and integrated circuit die packages can accordingly suffer warpage in the final assembly steps due to the relatively low coefficient of thermal expansion (CTE) of the die and the relatively high CTE of the substrate. Further, reworking of the solder-based die-to-substrate or die-to-die interconnect is not possible once the joint has been formed.

DETAILED DESCRIPTION

In embodiments herein, liquid metal (e.g., gallium-based alloys) interconnects may be implemented for FLIs to enable interconnect formation at lower temperatures, e.g., at or near room temperature. Such interconnects can be formed using metal pillars on the underside of the die that, when coupled to a substrate or other die, become in contact with a liquid metal (that is in contact with a metal pad/connector of the substrate/die) and accordingly form electrical connections with the substrate/die. The liquid metal may be within a well of the substrate/die. The following disclosure provides multiple examples of interconnect assemblies that can be used to implement die-to-die or die-to-substrate interconnects.

By implementing a LM-based interconnects as described herein, the interconnect can be formed at lower temperatures, e.g., at or near room temperature, which can allow for faster and/or cheaper manufacturing (e.g., due to not requiring heating steps required with solder-based interconnects). Moreover, package warping may be reduced or eliminated, e.g., because the heating is not needed and because the mechanical coupling between the die and the substrate/other die is reduced through the use of the LM., improving reliability and thermal performance. Additionally, underfill is not necessary in certain embodiments, which can improve signal integrity.

Further, LM-based interconnects as described here can be reworked if needed, unlike solder-based interconnects, which can allow for improved yields for integrated circuit packages. For instance, using a room temperature process and reversible interconnect may be advantageous with multichip packages (MCPs). Embodiments herein could, for example, allow for testing after dies have been picked and placed on a substrate. This would allow for the detection of bad die and/or substrate before a permanent bond is formed, and a bad die could be removed and replaced instead of needing to scrap the entire assembly as with permanent solder-based interconnects.

Figures 1A, 1B, 1C:
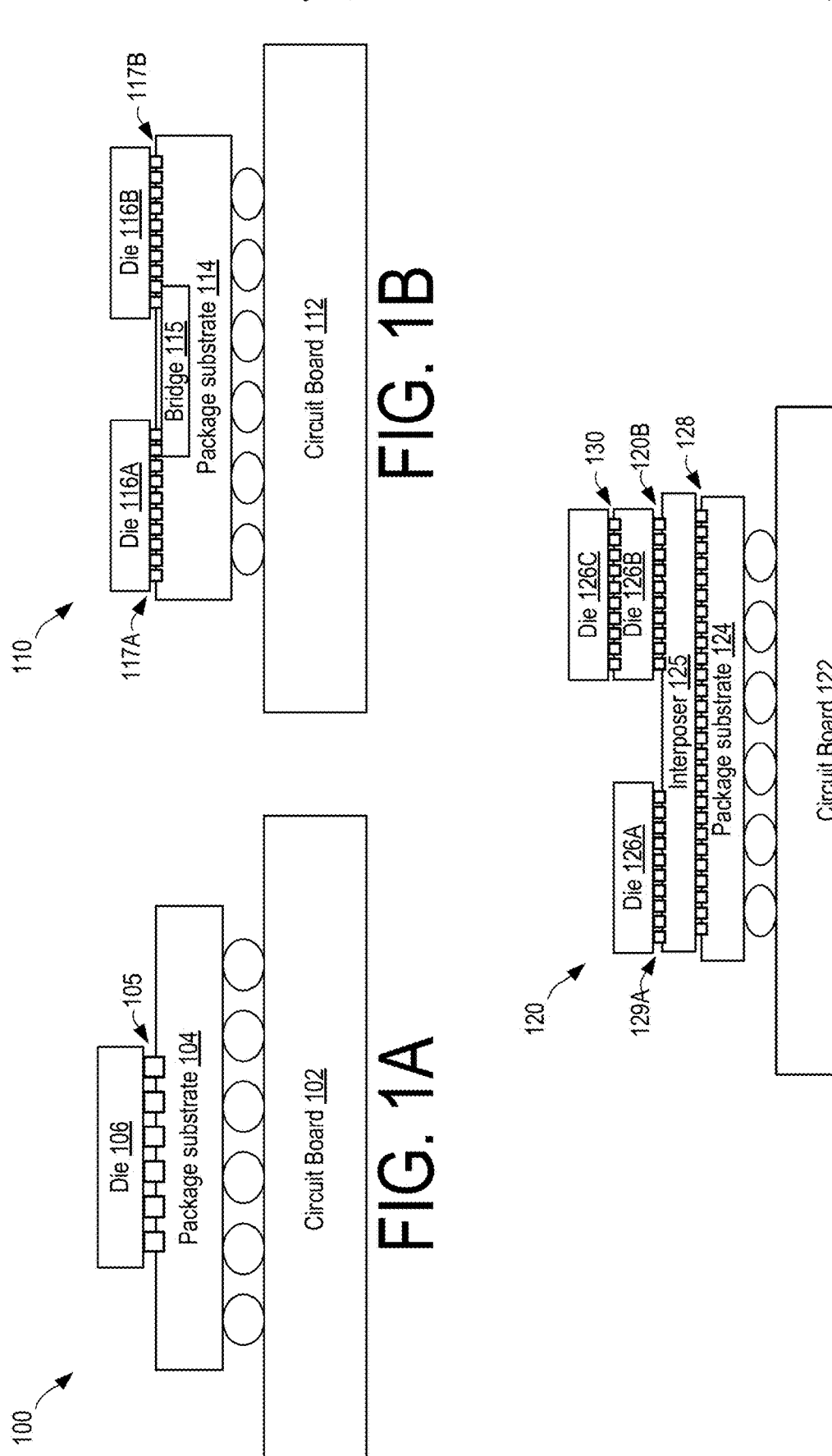
FIGS. 1A-1C illustrate example systems that may implement a liquid metal-based die interconnect in accordance with embodiments herein.

FIGS. 1A-1C illustrate example systems 100, 110, 120 that may implement a LM-based die interconnect in accordance with embodiments herein. The example system 100 of FIG. 1A includes a circuit board 102, which may be implemented as a motherboard or main board of a computer system in some embodiments, or as a base circuit board of a peripheral device (e.g., a graphics card, non-volatile memory PCIe device, etc.) that is to be connected to another circuit board (e.g., a motherboard of a computer system). The example system 100 also includes a package substrate 104 with an integrated circuit die 106 attached to the package substrate 104.

The die 106 may be a packaged or unpacked integrated circuit product that includes one or more integrated circuit dies (e.g., the die 602 of FIG. 6, the integrated circuit device 700 of FIG. 7) and/or one or more other suitable components. The die 106 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the die 106 can comprise one or more additional active or passive devices such as capacitors, decoupling capacitors, resistors, inductors, fuses, diodes, transformers, sensors, electrostatic discharge (ESD) devices, and memory devices. In addition to comprising one or more processor units, the die 106 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". The package substrate 104 may provide electrical connections between the die 106 and the circuit board 102, and, in some instances, may include additional active circuitry. The interconnection 105 between the die 106 and the substrate 104 may be implemented with a LM-based interconnect as described herein.

Similar to the system 100, the system 110 also includes a circuit board 112 with a package substrate 114 attached to the circuit board 112. The circuit board 112 may be implemented in the same or similar manner as the circuit board 102 and the package substrate 114 may be implemented in the same or similar manner as the package substrate 104. In the example system 110, however, the substrate 114 has an embedded bridge 115 to interconnect the dies 116A, 116B. The embedded bridge 115 may be an Intel® embedded multi-die interconnect bridges (EMIBs) in certain embodiments. The interconnections 117 between the dies 116 and the substrate 114 or bridge 115 may be implemented with a LM-based interconnect as described herein.

The system 120, like the systems 100, 110, includes a circuit board 122 that may be implemented in the same or similar manner as the circuit boards 102, 112. The example system 120 includes an interposer 125 between the substrate 124 and multiple dies 126. The interposer 125 may provide one or more interconnections between the dies 126 and may include active logic circuits in the interconnects and the package substrate 124 may provide interconnections between the circuit board 122 and the interposer 125, dies 126, or both. Any of interconnections shown, including the package-to-interposer interconnect 128, the interposer-to-die interconnects 129, or the die-to-die interconnect 130, may be implemented with a LM-based interconnect as described herein.

Figure 2:
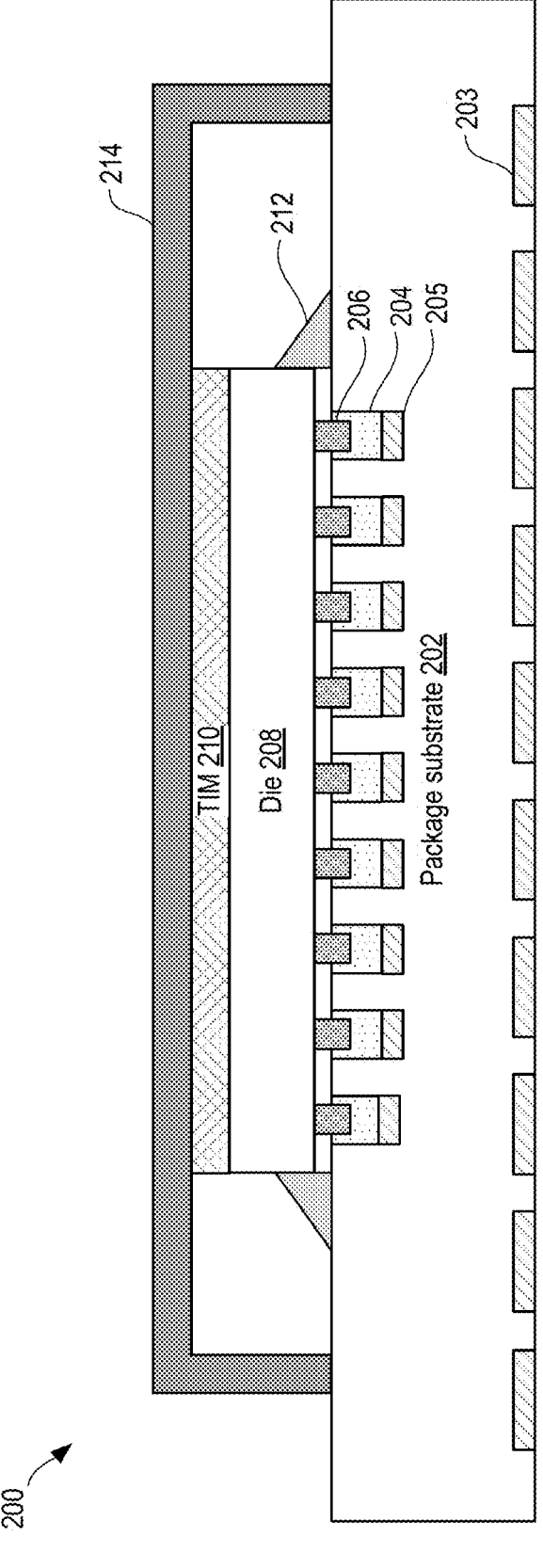
FIG. 2 illustrates an example integrated circuit assembly with a liquid metal-based interconnect in accordance with embodiments herein.

FIG. 2 illustrates an example integrated circuit assembly 200 with a liquid metal-based interconnect in accordance with embodiments herein. As shown, the assembly 200 includes a package substrate 202 with an integrated circuit die 208 coupled to it using a LM-based interconnect. The package substrate 202 includes metal pads 203 on a bottom side and wells 204 on a top side. The wells 204 are filled with a liquid metal, such as a Gallium-based alloy (e.g., eutectic or off-eutectic Ga/In, eutectic or off-eutectic Ga/Sn, eutectic or off-eutectic Ga/Sn/Zn, and eutectic or off-eutectic Ga/In/Sn). The die 208 includes a set of metal (e.g., Cu) pillars 206 extending from a bottom side (i.e., the side facing the substrate 202), and the pillars 206 fit within the wells 204 as shown to interface with the LM inside the wells 204. The wells 204 interface with electrical connectors 205 of the substrate 202. Accordingly, when connected as shown in FIG. 2, the pillars 206 of the die 208 become electrically connected with the connectors 205 via the LM within the wells 204. Although shown as being implemented as pillars within LM-filled wells, the LM-based interconnect of the assembly 200 may be implemented in another manner.

The package substrate 202 provides interconnections between circuitry of the die 208 and a main circuit board (i.e., between the pillars 206 of the die 208 and the pads 203 of the substrate 202). Because the LM-based interconnect shown does not provide a rigid coupling between the die 208 and the substrate, an additional material can be used to secure the die 208 to the substrate. In the example shown, the die 208 is secured to the substrate 202 using an adhesive 212 (e.g., corner glue) at the outside edges of the die 208. However, other embodiments may use an underfill material (e.g., capillary underfill (CUF)) between the die 208 and the substrate 202. Further, other embodiments may utilize a solder at the edges of the die-to-substrate joint to secure the die to the substrate (in lieu of or in addition to the adhesive 212). The example assembly 200 also includes a thermal interface material (TIM) 210 on a top side of the die 208, which provides a thermal interface between the die 208 and the lid 214, which encapsulates the die 208.

Figure 3:
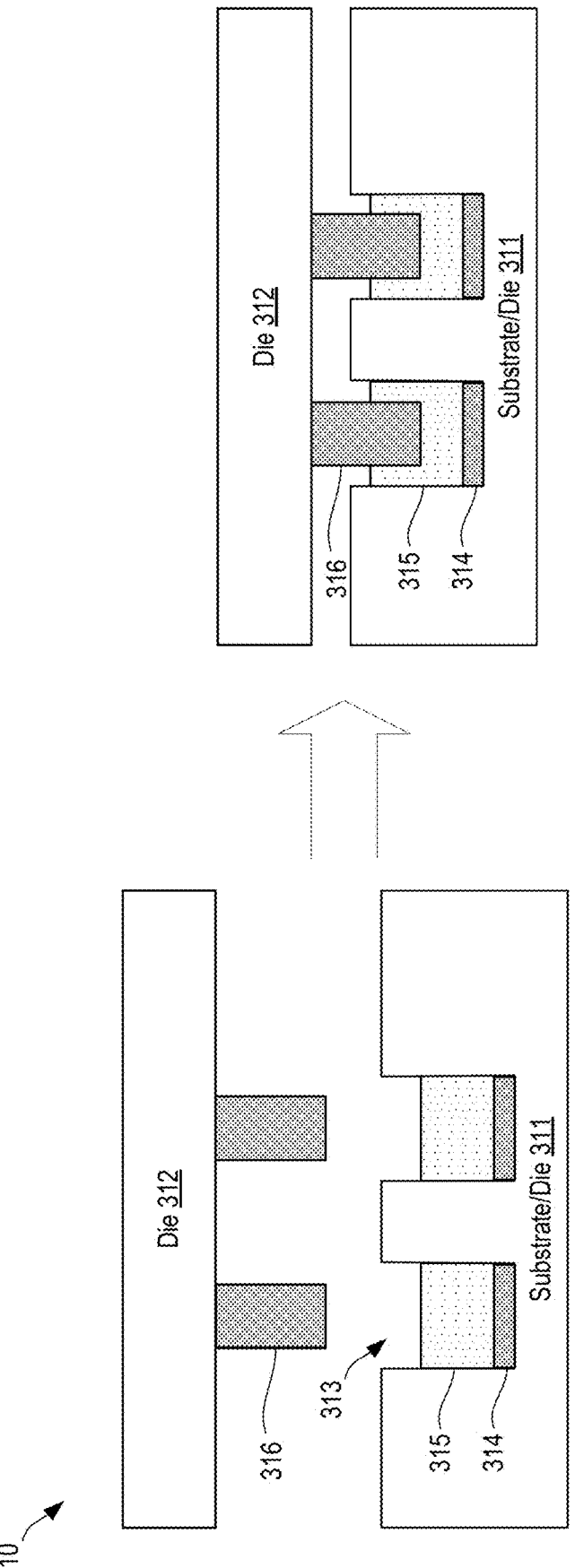
FIG. 3 illustrates an example embodiment of a liquid metal-based interconnect in accordance with embodiments herein.

FIG. 3 illustrates an example embodiment of a liquid metal-based interconnect in accordance with embodiments herein. The example LM-based interconnect 310 between the substrate/die is implemented in a similar manner as shown in FIG. 2. In particular, the LM-based interconnect 310 is implemented between a substrate or integrated circuit die 311 and an integrated circuit die 312 via a well 313 formed within the substrate/die 311 that has LM 315 therein. The LM 315 is in contact with an electrical connector 314 (e.g., a metal pad) of the substrate/die 311. The electrical connector 314 may come into electrical connection with the metal pillars 316 of the die 312 when the pillars 316 are placed into the wells and make contact with the LM 315.

The metal pillars 316 may be implemented as Copper pillars in certain embodiments. The Copper pillars can have various finishes or platings applied thereto. For example, the surface can be bare Copper (for a Copper pillar), or can have Copper, Nickel, Ga$_2$O$_3$, Silver, Platinum, Gold, Titanium, or Tungsten (or a combination thereof) plated on the metal pillar. In some instances, the pillar may be plated with a metal that is resistant to corrosion, e.g., from Gallium in a Gallium-based LM 315. In some instances, the pillar may be plated with a metal (e.g., Ni, W) or another type of electrically conductive passivation layer to prevent a Cu pillar from alloying with Ga in the LM 315. The surface finish of the pillars can be smooth or rough, with a rough surface potentially enabling better wetting to the LM 315 by being able to readily break any LM oxide layer that forms. The electrical connectors 314 may be metal pads, which may be plated with Nickel to protect the underlining metal (e.g., copper) from corrosion (e.g., from Gallium in a Gallium-based LM 315). Other metals, such as Platinum, could be plated on the connector 314 to enable spontaneous wetting of the LM 315 to the connector 314.

The LM 315 can be any gallium-based alloy, such as eutectic or off-eutectic Ga/In, eutectic or off-eutectic Ga/Sn, eutectic or off-eutectic Ga/Sn/Zn, and eutectic or off-eutectic Ga/In/Sn. These alloys can be further modified to contain Ga$_2$O$_3$ by mixing the LM alloy in air to spontaneous make the LM alloy into a paste consistency. Other additives can be incorporated such as ceramic (e.g., ZnO, AlO, BN, AlN, SiO$_2$) or polymeric fillers.

Figure 4:
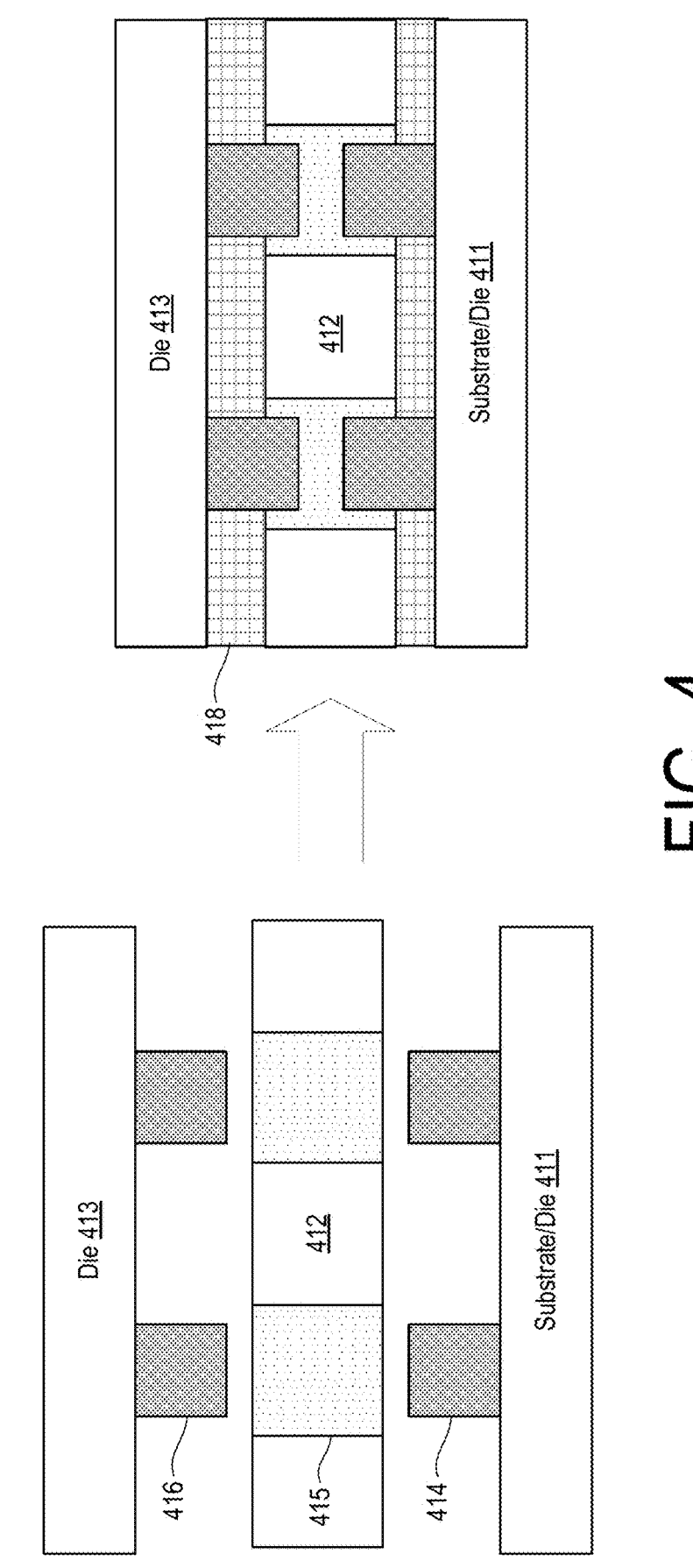
FIG. 4 illustrates an example embodiment of a liquid metal-based interconnect between an integrated circuit die, an interposer, and a substrate/integrated circuit die in accordance with embodiments herein.

FIG. 4 illustrates an example embodiment of a liquid metal-based interconnect 400 between an integrated circuit die 413, an interposer 412, and a substrate/integrated circuit die 411 in accordance with embodiments herein. In the example shown, the substrate/die 411 includes metal pillars 414 and the die 413 also includes metal pillars 416. The metal pillars 414, 416 may be formed in the same or similar manner as described above with respect to the metal pillars 316. The interposer 412 includes vias 415 (e.g., through silicon vias (TSVs) for a silicon interposer, or through glass vias (TGVs) for a glass interposer) that are filled with LM. The LM may be placed into the vias 415 using, e.g., screen printing, jet dispensing, or another similar process. The metal pillars 414, 416 would then come into contact with the LM inside the vias 415 when coupled together (as shown in the right side of FIG. 4), creating an electrical connection between the metal pillars 414, 416, and thus, the circuitry of the substrate/die 411 and the die 413.

The LM-based interconnect 400 shown in FIG. 4 could allow for multiple die stacks with active or passive die and LM TSVs used where traditional TSVs are used today. In other embodiments, the LM-based interconnect 400 could implement a polymeric interposer with LM filled vias, with the polymeric interposer being a ridged or soft polymer. A soft polymer could enable a compressible interposer in certain instances.

Figure 5:
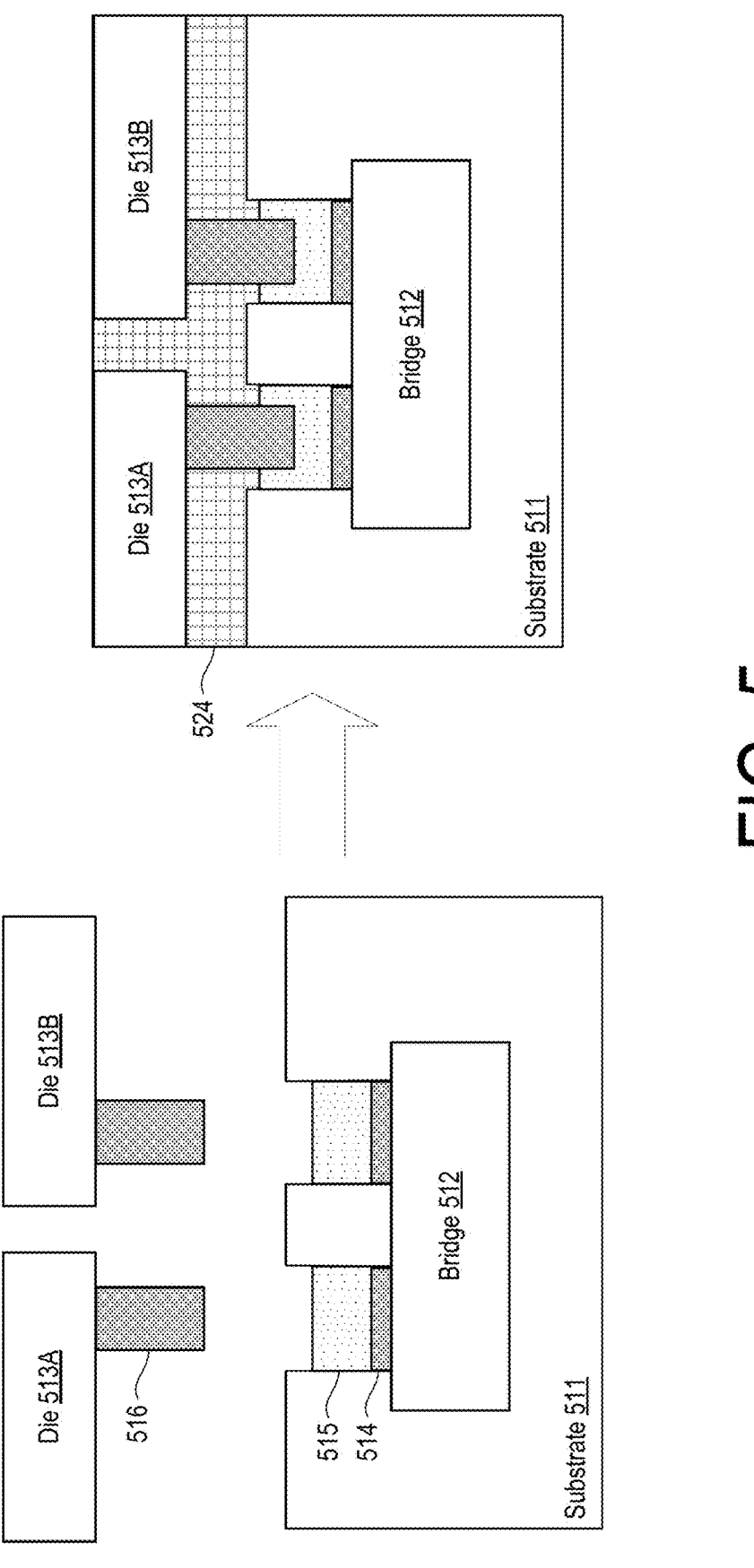
FIG. 5 illustrates an example embodiment of a liquid metal-based interconnect implemented with an embedded bridge in accordance with embodiments herein.

FIG. 5 illustrates an example embodiment of a liquid metal-based interconnect 500 implemented with an embedded bridge 512 in accordance with embodiments herein. In the example shown, the substrate 511 includes an embedded bridge 512 (e.g., an Intel® embedded multi-die interconnect bridge (EMIB)) that includes circuitry to interconnect the integrated circuit dies 513A, 513B. The substrate 511 includes wells with LM 515 inside the wells and making contact with electrical connector pads 514 at the bottom of the wells, similar to the example shown in FIG. 3. The dies 513 includes metal pillars 516, which can be implemented in the same or similar manner as described above with respect to the metal pillars 316. The metal pillars may make contact with the LM 515 when the dies 513 are coupled to the substrate 511, creating an electrical connection between the metal pillars 516 and the pads 514. Once the dies 513 have been coupled to the substrate 511, the dies may be in electrical connection with the bridge 512, and thus with one another. In certain embodiments, an underfill material 524 (e.g., epoxy) can then be used to secure the dies 513 to the substrate 511.

In certain embodiments, there can be use of a mix of traditional solder-based interconnects and the LM-based interconnects described above. For instance, traditional solder interconnects or joints could be used on the edges of a die to help hold the die in place before LM-based interconnect joints are protected with a corner glue (e.g., as shown in FIG. 2) or an underfill (e.g., as shown in FIGS. 4-5).

Figure 6:
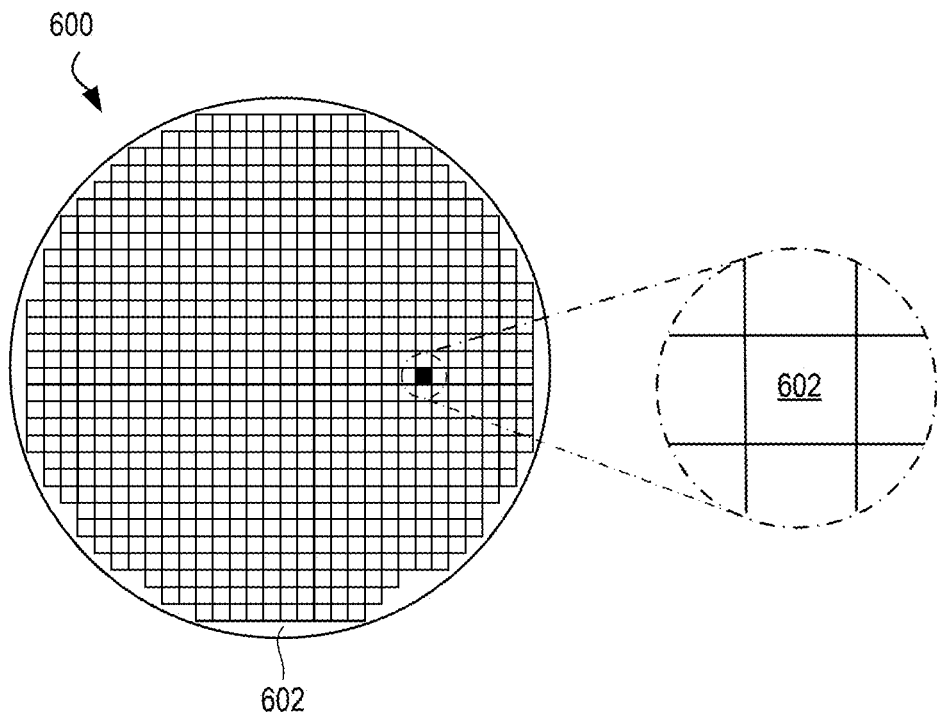
FIG. 6 is a top view of a wafer and dies that may be included in embodiments disclosed herein.

FIG. 6 is a top view of a wafer 600 and dies 602 that may incorporate any of the embodiments disclosed herein. The wafer 600 may be composed of semiconductor material and may include one or more dies 602 having integrated circuit structures formed on a surface of the wafer 600. The individual dies 602 may be a repeating unit of an integrated circuit product that includes any suitable integrated circuit. After the fabrication of the semiconductor product is complete, the wafer 600 may undergo a singulation process in which the dies 602 are separated from one another to provide discrete "chips" of the integrated circuit product. The die 602 may include one or more transistors (e.g., some of the transistors 740 of FIG. 7, discussed below), supporting circuitry to route electrical signals to the transistors, passive components (e.g., signal traces, resistors, capacitors, or inductors), and/or any other integrated circuit components. In some embodiments, the wafer 600 or the die 602 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processor unit (e.g., the processor unit 902 of FIG. 9) or other logic that is configured to store information in the memory devices or execute instructions stored in the memory array.

Figure 7:
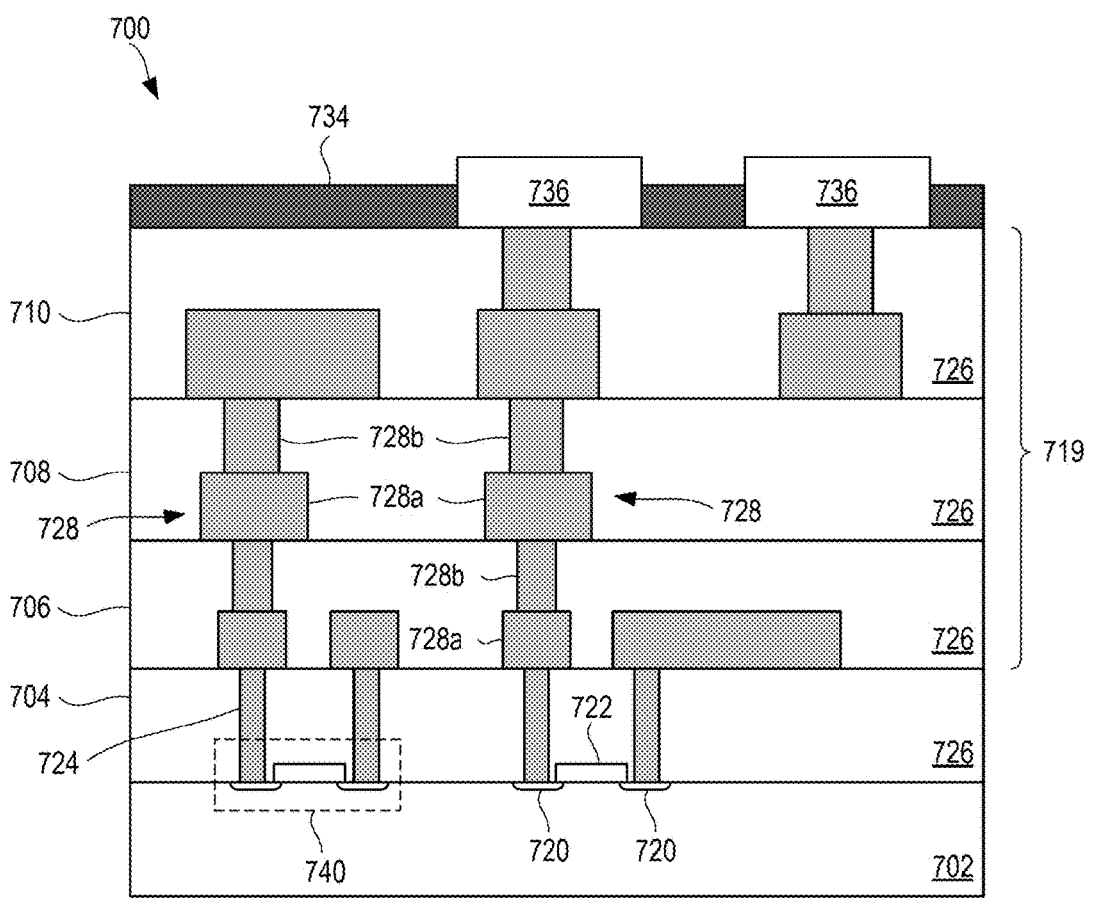
FIG. 7 is a cross-sectional side view of an integrated circuit device that may be included in embodiments herein.

FIG. 7 is a cross-sectional side view of an integrated circuit device 700 that may be included in embodiments herein. One or more of the integrated circuit devices 700 may be included in one or more dies 602 (FIG. 6). The integrated circuit device 700 may be formed on a die substrate 702 (e.g., the wafer 600 of FIG. 6) and may be included in a die (e.g., the die 602 of FIG. 6). The die substrate 702 may be a semiconductor substrate composed of semiconductor material systems including, for example, n-type or p-type materials systems (or a combination of both). The die substrate 702 may include, for example, a crystalline substrate formed using a bulk silicon or a silicon-on-insulator (SOI) substructure. In some embodiments, the die substrate 702 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 702. Although a few examples of materials from which the die substrate 702 may be formed are described here, any material that may serve as a foundation for an integrated circuit device 700 may be used. The die substrate 702 may be part of a singulated die (e.g., the dies 602 of FIG. 6) or a wafer (e.g., the wafer 600 of FIG. 6).

The integrated circuit device 700 may include one or more device layers 704 disposed on the die substrate 702. The device layer 704 may include features of one or more transistors 740 (e.g., metal oxide semiconductor field-effect transistors (MOSFETs)) formed on the die substrate 702. The transistors 740 may include, for example, one or more source and/or drain (S/D) regions 720, a gate 722 to control current flow between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 7, a transistor 740 may include a gate 722 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 740 along the source-channel-drain direction, the gate electrode may consist of a U-shaped structure that includes a bottom portion substantially parallel to the surface of the die substrate 702 and two sidewall portions that are substantially perpendicular to the top surface of the die substrate 702. In other embodiments, at least one of the metal layers that form the gate electrode may simply be a planar layer that is substantially parallel to the top surface of the die substrate 702 and does not include sidewall portions substantially perpendicular to the top surface of the die substrate 702. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the die substrate 702 adjacent to the gate 722 of individual transistors 740. The S/D regions 720 may be formed using an implantation/diffusion process or an etching/deposition process, for example. In the former process, dopants such as boron, aluminum, antimony, phosphorous, or arsenic may be ion-implanted into the die substrate 702 to form the S/D regions 720. An annealing process that activates the dopants and causes them to diffuse farther into the die substrate 702 may follow the ion-implantation process. In the latter process, the die substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the devices (e.g., transistors 740) of the device layer 704 through one or more interconnect layers disposed on the device layer 704 (illustrated in FIG. 7 as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form a metallization stack (also referred to as an "ILD stack") 719 of the integrated circuit device 700.

The interconnect structures 728 may be arranged within the interconnect layers 706-710 to route electrical signals according to a wide variety of designs; in particular, the arrangement is not limited to the particular configuration of interconnect structures 728 depicted in FIG. 7. Although a particular number of interconnect layers 706-710 is depicted in FIG. 7, embodiments of the present disclosure include integrated circuit devices having more or fewer interconnect layers than depicted.

In some embodiments, the interconnect structures 728 may include lines 728*a* and/or vias 728*b* filled with an electrically conductive material such as a metal. The lines 728*a* may be arranged to route electrical signals in a direction of a plane that is substantially parallel with a surface of the die substrate 702 upon which the device layer 704 is formed. For example, the lines 728*a* may route electrical signals in a direction in and out of the page and/or in a direction across the page from the perspective of FIG. 7. The vias 728*b* may be arranged to route electrical signals in a direction of a plane that is substantially perpendicular to the surface of the die substrate 702 upon which the device layer 704 is formed. In some embodiments, the vias 728*b* may electrically couple lines 728*a* of different interconnect layers 706-710 together.

The interconnect layers 706-710 may include a dielectric material 726 disposed between the interconnect structures 728, as shown in FIG. 7. In some embodiments, dielectric material 726 disposed between the interconnect structures 728 in different ones of the interconnect layers 706-710 may have different compositions; in other embodiments, the composition of the dielectric material 726 between different interconnect layers 706-710 may be the same. The device layer 704 may include a dielectric material 726 disposed between the transistors 740 and a bottom layer of the metallization stack as well. The dielectric material 726 included in the device layer 704 may have a different composition than the dielectric material 726 included in the interconnect layers 706-710; in other embodiments, the composition of the dielectric material 726 in the device layer 704 may be the same as a dielectric material 726 included in any one of the interconnect layers 706-710.

A first interconnect layer 706 (referred to as Metal 1 or "M1") may be formed directly on the device layer 704. In some embodiments, the first interconnect layer 706 may include lines 728*a* and/or vias 728*b*, as shown. The lines 728*a* of the first interconnect layer 706 may be coupled with contacts (e.g., the S/D contacts 724) of the device layer 704. The vias 728*b* of the first interconnect layer 706 may be coupled with the lines 728*a* of a second interconnect layer 708.

The second interconnect layer 708 (referred to as Metal 2 or "M2") may be formed directly on the first interconnect layer 706. In some embodiments, the second interconnect layer 708 may include via 728*b* to couple the lines 728 of the second interconnect layer 708 with the lines 728*a* of a third interconnect layer 710. Although the lines 728*a* and the vias 728*b* are structurally delineated with a line within individual interconnect layers for the sake of clarity, the lines 728*a* and the vias 728*b* may be structurally and/or materially contiguous (e.g., simultaneously filled during a dual-damascene process) in some embodiments.

The third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706. In some embodiments, the interconnect layers that are "higher up" in the metallization stack 719 in the integrated circuit device 700 (i.e., farther away from the device layer 704) may be thicker that the interconnect layers that are lower in the metallization stack 719, with lines 728a and vias 728b in the higher interconnect layers being thicker than those in the lower interconnect layers.

The integrated circuit device 700 may include a solder resist material 734 (e.g., polyimide or similar material) and one or more conductive contacts 736 formed on the interconnect layers 706-710. In FIG. 7, the conductive contacts 736 are illustrated as taking the form of bond pads. The conductive contacts 736 may be electrically coupled with the interconnect structures 728 and configured to route the electrical signals of the transistor(s) 740 to external devices. For example, solder bonds may be formed on the one or more conductive contacts 736 to mechanically and/or electrically couple an integrated circuit die including the integrated circuit device 700 with another component (e.g., a printed circuit board). The integrated circuit device 700 may include additional or alternate structures to route the electrical signals from the interconnect layers 706-710; for example, the conductive contacts 736 may include other analogous features (e.g., posts) that route the electrical signals to external components.

In some embodiments in which the integrated circuit device 700 is a double-sided die, the integrated circuit device 700 may include another metallization stack (not shown) on the opposite side of the device layer(s) 704. This metallization stack may include multiple interconnect layers as discussed above with reference to the interconnect layers 706-710, to provide conductive pathways (e.g., including conductive lines and vias) between the device layer(s) 704 and additional conductive contacts (not shown) on the opposite side of the integrated circuit device 700 from the conductive contacts 736.

In other embodiments in which the integrated circuit device 700 is a double-sided die, the integrated circuit device 700 may include one or more through silicon vias (TSVs) through the die substrate 702; these TSVs may make contact with the device layer(s) 704, and may provide conductive pathways between the device layer(s) 704 and additional conductive contacts (not shown) on the opposite side of the integrated circuit device 700 from the conductive contacts 736. In some embodiments, TSVs extending through the substrate can be used for routing power and ground signals from conductive contacts on the opposite side of the integrated circuit device 700 from the conductive contacts 736 to the transistors 740 and any other components integrated into the die 700, and the metallization stack 719 can be used to route I/O signals from the conductive contacts 736 to transistors 740 and any other components integrated into the die 700.

Multiple integrated circuit devices 700 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 8:
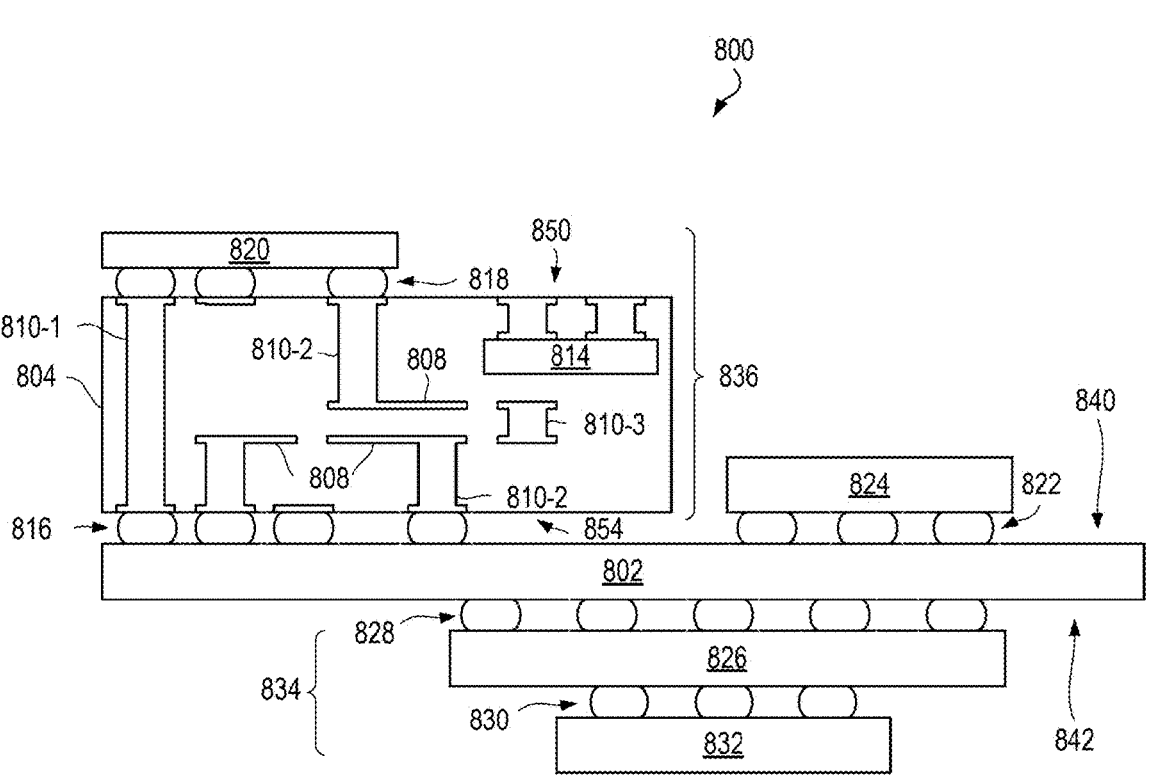
FIG. 8 is a cross-sectional side view of an integrated circuit device assembly that may include embodiments disclosed herein.

FIG. 8 is a cross-sectional side view of an integrated circuit device assembly 800 that may include any of the embodiments disclosed herein. The integrated circuit device assembly 800 includes a number of components disposed on a circuit board 802 (which may be a motherboard, system board, mainboard, etc.). The integrated circuit device assembly 800 includes components disposed on a first face 840 of the circuit board 802 and an opposing second face 842 of the circuit board 802; generally, components may be disposed on one or both faces 840 and 842.

In some embodiments, the circuit board 802 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate. The integrated circuit device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 836 may include an integrated circuit component 820 coupled to an interposer 804 by coupling components 818. The coupling components 818 may take any suitable form for the application, such as the forms discussed above with reference to the coupling components 816. Although a single integrated circuit component 820 is shown in FIG. 8, multiple integrated circuit components may be coupled to the interposer 804; indeed, additional interposers may be coupled to the interposer 804. The interposer 804 may provide an intervening substrate used to bridge the circuit board 802 and the integrated circuit component 820.

The integrated circuit component 820 may be a packaged or unpacked integrated circuit product that includes one or more integrated circuit dies (e.g., the die 602 of FIG. 6, the integrated circuit device 700 of FIG. 7) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 820, a single monolithic integrated circuit die comprises solder bumps attached to contacts on the die. The solder bumps allow the die to be directly attached to the interposer 804. The integrated circuit component 820 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 820 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 820 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 820 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 804 may spread connections to a wider pitch or reroute a connection to a different connection. For example, the interposer 804 may couple the integrated circuit component 820 to a set of ball grid array (BGA) conductive contacts of the coupling components 816 for coupling to the circuit board 802. In the embodiment illustrated in FIG. 8, the integrated circuit component 820 and the circuit board 802 are attached to opposing sides of the interposer 804; in other embodiments, the integrated circuit component 820 and the circuit board 802 may be attached to a same side of the interposer 804. In some embodiments, three or more components may be interconnected by way of the interposer 804.

In some embodiments, the interposer 804 may be formed as a PCB, including multiple metal layers separated from one another by layers of dielectric material and interconnected by electrically conductive vias. In some embodiments, the interposer 804 may be formed of an epoxy resin, a fiberglass-reinforced epoxy resin, an epoxy resin with inorganic fillers, a ceramic material, or a polymer material such as polyimide. In some embodiments, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through hole vias 810-1 (that extend from a first face 850 of the interposer 804 to a second face 854 of the interposer 804), blind vias 810-2 (that extend from the first or second faces 850 or 854 of the interposer 804 to an internal metal layer), and buried vias 810-3 (that connect internal metal layers).

In some embodiments, the interposer 804 can comprise a silicon interposer. Through silicon vias (TSV) extending through the silicon interposer can connect connections on a first face of a silicon interposer to an opposing second face of the silicon interposer. In some embodiments, an interposer 804 comprising a silicon interposer can further comprise one or more routing layers to route connections on a first face of the interposer 804 to an opposing second face of the interposer 804.

The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art. In embodiments where the interposer is a non-printed circuit board.

The integrated circuit device assembly 800 may include an integrated circuit component 824 coupled to the first face 840 of the circuit board 802 by coupling components 822. The coupling components 822 may take the form of any of the embodiments discussed above with reference to the coupling components 816, and the integrated circuit component 824 may take the form of any of the embodiments discussed above with reference to the integrated circuit component 820.

The integrated circuit device assembly 800 illustrated in FIG. 8 includes a package-on-package structure 834 coupled to the second face 842 of the circuit board 802 by coupling components 828. The package-on-package structure 834 may include an integrated circuit component 826 and an integrated circuit component 832 coupled together by coupling components 830 such that the integrated circuit component 826 is disposed between the circuit board 802 and the integrated circuit component 832. The coupling components 828 and 830 may take the form of any of the embodiments of the coupling components 816 discussed above, and the integrated circuit components 826 and 832 may take the form of any of the embodiments of the integrated circuit component 820 discussed above. The package-on-package structure 834 may be configured in accordance with any of the package-on-package structures known in the art.

Figure 9:
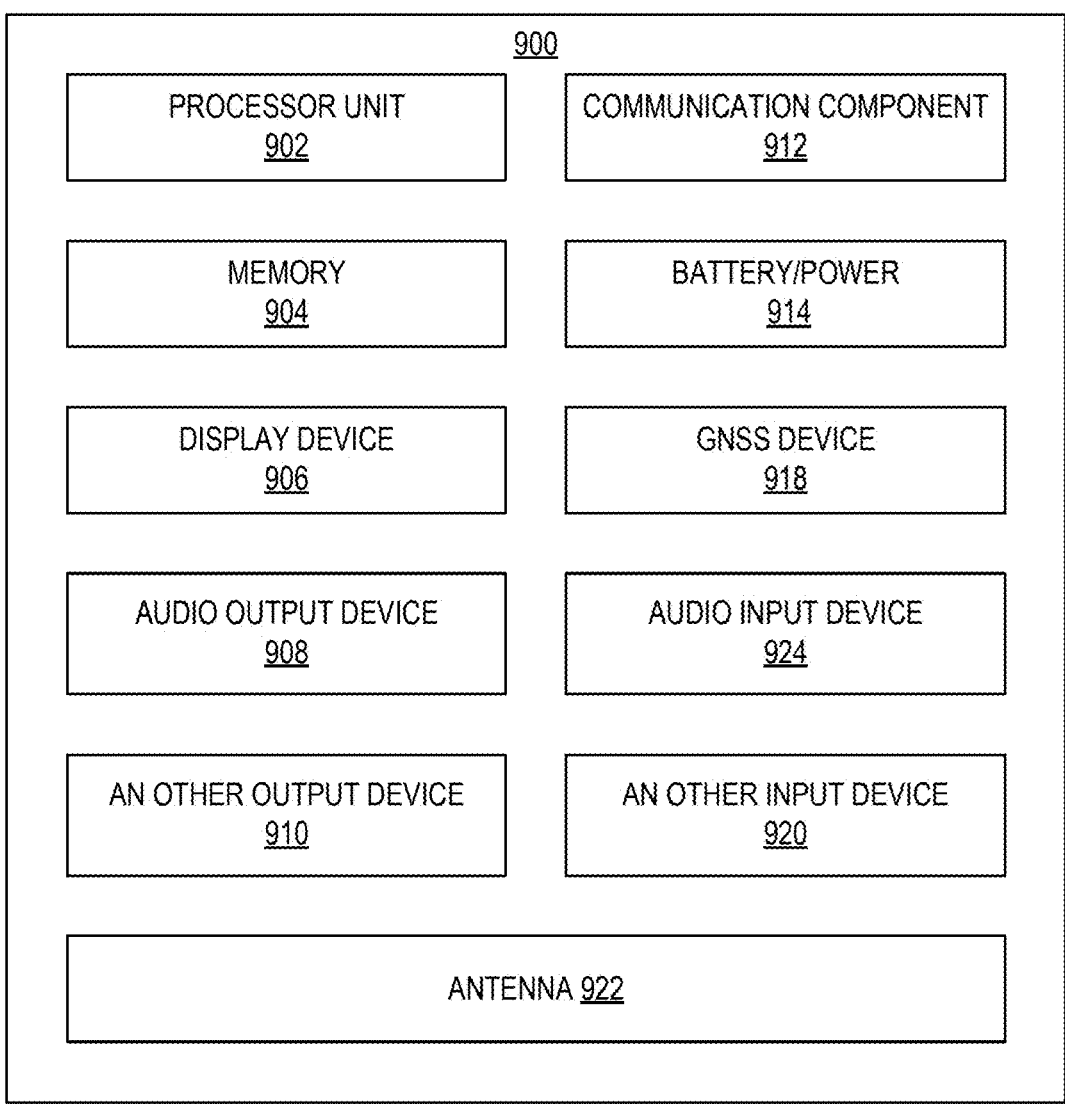
FIG. 9 is a block diagram of an example electrical device that may include embodiments disclosed herein.

FIG. 9 is a block diagram of an example electrical device 900 that may include one or more of the embodiments disclosed herein. For example, any suitable ones of the components of the electrical device 900 may include one or more of the integrated circuit device assemblies 800, integrated circuit components 820, integrated circuit devices 700, or integrated circuit dies 602 disclosed herein. A number of components are illustrated in FIG. 9 as included in the electrical device 900, but any one or more of these components may be omitted or duplicated, as suitable for the application. In some embodiments, some or all of the components included in the electrical device 900 may be attached to one or more motherboards mainboards, or system boards. In some embodiments, one or more of these components are fabricated onto a single system-on-a-chip (SoC) die.

Additionally, in various embodiments, the electrical device 900 may not include one or more of the components illustrated in FIG. 9, but the electrical device 900 may include interface circuitry for coupling to the one or more components. For example, the electrical device 900 may not include a display device 906, but may include display device interface circuitry (e.g., a connector and driver circuitry) to which a display device 906 may be coupled. In another set of examples, the electrical device 900 may not include an audio input device 924 or an audio output device 908, but may include audio input or output device interface circuitry (e.g., connectors and supporting circuitry) to which an audio input device 924 or audio output device 908 may be coupled.

The electrical device 900 may include one or more processor units 902 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 902 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 900 may include a memory 904, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 904 may include memory that is located on the same integrated circuit die as the processor unit 902. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 900 can comprise one or more processor units 902 that are heterogeneous or asymmetric to another processor unit 902 in the electrical device 900. There can be a variety of differences between the processing units 902 in a system in terms of a spectrum of metrics of merit including architectural, microarchitectural, thermal, power consumption characteristics, and the like. These differences can effectively manifest themselves as asymmetry and heterogeneity among the processor units 902 in the electrical device 900.

In some embodiments, the electrical device 900 may include a communication component 912 (e.g., one or more communication components). For example, the communication component 912 can manage wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 912 may operate in accordance with other wireless protocols in other embodiments. The electrical device 900 may include an antenna 922 to facilitate wireless communications and/or to receive other wireless communications (such as AM or FM radio transmissions).

In some embodiments, the communication component 912 may manage wired communications, such as electrical, optical, or any other suitable communication protocols (e.g., IEEE 802.3 Ethernet standards). As noted above, the communication component 912 may include multiple communication components. For instance, a first communication component 912 may be dedicated to shorter-range wireless communications such as Wi-Fi or Bluetooth, and a second communication component 912 may be dedicated to longer-range wireless communications such as global positioning system (GPS), EDGE, GPRS, CDMA, WiMAX, LTE, EV-DO, or others. In some embodiments, a first communication component 912 may be dedicated to wireless communications, and a second communication component 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display device 906 (or corresponding interface circuitry, as discussed above). The display device 906 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any embedded or wired or wirelessly connected external device that generates an audible indicator, such speakers, headsets, or earbuds.

The electrical device 900 may include an audio input device 924 (or corresponding interface circuitry, as discussed above). The audio input device 924 may include any embedded or wired or wirelessly connected device that generates a signal representative of a sound, such as microphones, microphone arrays, or digital instruments (e.g., instruments having a musical instrument digital interface (MIDI) output). The electrical device 900 may include a Global Navigation Satellite System (GNSS) device 918 (or corresponding interface circuitry, as discussed above), such as a Global Positioning System (GPS) device. The GNSS device 918 may be in communication with a satellite-based system and may determine a geolocation of the electrical device 900 based on information received from one or more GNSS satellites, as known in the art.

The electrical device 900 may include another output device 910 (or corresponding interface circuitry, as discussed above). Examples of the other output device 910 may include an audio codec, a video codec, a printer, a wired or wireless transmitter for providing information to other devices, or an additional storage device.

The electrical device 900 may include another input device 920 (or corresponding interface circuitry, as discussed above). Examples of the other input device 920 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 900 may be any other electronic device that processes data. In some embodiments, the electrical device 900 may comprise multiple discrete physical components. Given the range of devices that the electrical device 900 can be manifested as in various embodiments, in some embodiments, the electrical device 900 can be referred to as a computing device or a computing system.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is an integrated circuit assembly comprising: a substrate comprising electrical connectors on a top side of the substrate; and an integrated circuit die coupled to the top side of the substrate, the integrated circuit die comprising metal pillars extending from a bottom side of the die facing the top side of the substrate; wherein the metal pillars of the integrated circuit die are electrically connected to the electrical connectors of the substrate via a liquid metal.

Example 2 includes the subject matter of Example 1, where the substrate comprises a plurality of wells defined on the top side of the substrate and the metal pillars of the integrated circuit die are disposed at least partially within the wells.

Example 3 includes the subject matter of Example 1, wherein the electrical connectors of the substrate include a plurality of metal pillars extending from the top side of the substrate.

Example 4 includes the subject matter of any one of Examples 1-3, further comprising an underfill material between the substrate and the integrated circuit die.

Example 5 includes the subject matter of Example 3, further comprising an interposer between the substrate and the integrated circuit die, the interposer defining a plurality of holes in which the metal pillars of the integrated circuit die and the metal pillars of the substrate are disposed.

Example 6 includes the subject matter of Example 5, further comprising an underfill material between the substrate and the interposer and an underfill material between the interposer and the integrated circuit die.

Example 7 includes the subject matter of any one of Examples 1-6, further comprising an adhesive material along an outer edge of the integrated circuit die to couple the integrated circuit die to the substrate.

Example 8 includes the subject matter of any one of Examples 1-7, wherein the integrated circuit die is a first integrated circuit die, the integrated circuit assembly further comprises a second integrated circuit die and bridge circuitry within the substrate to interconnect the first integrated circuit die and the second integrated circuit die.

Example 9 includes the subject matter of any one of Examples 1-8, wherein the metal pillars of the integrated circuit die comprise one or more of Copper, Nickel, Gallium, Oxygen, Silver, Platinum, Gold, Titanium, and Tungsten.

Example 10 includes the subject matter of any one of Examples 1-9, wherein the liquid metal is a eutectic alloy comprising Gallium and one or more of Indium, Tin, Zinc, and Oxygen.

Example 11 is a multi-die integrated circuit assembly comprising: a first integrated circuit die comprising electrical connectors on a top side of the integrated circuit die; and a second integrated circuit die coupled to the top side of the first integrated circuit die, the second integrated circuit die comprising metal pillars extending from a bottom side of the second integrated circuit die facing the top side of the first integrated circuit die; wherein the metal pillars of the second integrated circuit die are electrically connected to the electrical connectors of the first integrated circuit die via a liquid metal.

Example 12 includes the subject matter of Example 11, where the first integrated circuit die comprises a plurality of wells defined on the top side of the first integrated circuit die and the metal pillars of the second integrated circuit die are disposed at least partially within the wells.

Example 13 includes the subject matter of Example 11, wherein the electrical connectors of the first integrated circuit die include a plurality of metal pillars extending from the top side of the first integrated circuit die.

Example 14 includes the subject matter of any one of Examples 11-13, further comprising an underfill material between the substrate and the integrated circuit die.

Example 15 includes the subject matter of Example 13, further comprising an interposer between the first integrated circuit die and the second integrated circuit die, the interposer defining a plurality of holes in which the metal pillars of the first integrated circuit die and the metal pillars of the second integrated circuit die are disposed.

Example 16 includes the subject matter of Example 15, further comprising an underfill material between the substrate and the interposer and an underfill material between the interposer and the integrated circuit die.

Example 17 includes the subject matter of any one of Examples 11-16, further comprising a substrate, wherein the first integrated circuit die is coupled to a top side of the substrate.

Example 18 includes the subject matter of Example 17, wherein the first integrated circuit die comprises metal pillars extending from a bottom side of the first integrated circuit die, the metal pillars of the first integrated circuit die electrically connected to the substrate via a liquid metal.

Example 19 includes the subject matter of Example 18, further comprising an interposer between the substrate and the first integrated circuit die, the interposer defining a plurality of holes in which the metal pillars of the first integrated circuit die are disposed.

Example 20 includes the subject matter of Examples 11-19, wherein the metal pillars of the integrated circuit die comprise one or more of Copper, Nickel, Gallium, Oxygen, Silver, Platinum, Gold, Titanium, and Tungsten.

Example 21 includes the subject matter of Examples 11-20, wherein the liquid metal is a eutectic alloy comprising Gallium and one or more of Indium, Tin, Zinc, and Oxygen.

Example 22 is a system comprising: a main circuit board; and an integrated circuit assembly of any one of Examples 1-21 coupled to the main circuit board.

Example 23 is a system comprising: a main circuit board; an integrated circuit assembly coupled to the main circuit board and comprising: a substrate comprising electrical connectors on a top side of the substrate; and an integrated circuit die coupled to the top side of the substrate, the integrated circuit die comprising metal pillars extending from a bottom side of the die facing the top side of the substrate; wherein the metal pillars of the integrated circuit die are electrically connected to the electrical connectors of the substrate via a liquid metal.

Example 24 includes the subject matter of Example 23, wherein: the integrated circuit die is a first integrated circuit die and the integrated circuit assembly further comprises a second integrated circuit die coupled to the substrate; the substrate comprises bridge circuitry to interconnect the first integrated circuit die and the second integrated circuit die; and the second integrated circuit die comprises metal pillars that are electrically connected to electrical connectors of the substrate via a liquid metal.

Example 25 includes the subject matter of Example 23 or 24, the integrated circuit die is a first integrated circuit die and the integrated circuit assembly further comprises a second integrated circuit die coupled to a top side of the first integrated circuit die opposite the substrate, wherein the second integrated circuit die comprises metal pillars that are electrically connected to electrical connectors on the top side of the first integrated circuit die via a liquid metal.

Example 26 includes the subject matter of any one of Examples 23-25, wherein: the metal pillars of the integrated circuit die comprise one or more of Copper, Nickel, Gallium, Oxygen, Silver, Platinum, Gold, Titanium, and Tungsten Example 27 includes the subject matter of any one of Examples 23-25, wherein: the liquid metal is a eutectic or non-eutectic alloy comprising Gallium and one or more of Indium, Tin, Zinc, and Oxygen.

In the above description, various aspects of the illustrative implementations have been described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations have been set forth to provide a thorough understanding of the illustrative implementations. However, it will be apparent to one skilled in the art that the present disclosure may be practiced without all of the specific details. In other instances, well-known features have been omitted or simplified in order not to obscure the illustrative implementations.

The above description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The invention claimed is:

1. An integrated circuit assembly comprising:
a substrate comprising electrical connectors on a top side of the substrate; and
an integrated circuit die coupled to the top side of the substrate, the integrated circuit die comprising metal pillars extending from a bottom side of the die facing the top side of the substrate;
wherein the metal pillars of the integrated circuit die are electrically connected to the electrical connectors of the substrate via a liquid metal.

2. The integrated circuit assembly of claim 1, where the substrate comprises a plurality of wells defined on the top side of the substrate and the metal pillars of the integrated circuit die are disposed at least partially within the wells.

3. The integrated circuit assembly of claim 1, further comprising an underfill material between the substrate and the integrated circuit die.

4. The integrated circuit assembly of claim 1, wherein the electrical connectors of the substrate include a plurality of metal pillars extending from the top side of the substrate.

5. The integrated circuit assembly of claim 4, further comprising an interposer between the substrate and the integrated circuit die, the interposer defining a plurality of holes in which the metal pillars of the integrated circuit die and the metal pillars of the substrate are disposed.

6. The integrated circuit assembly of claim 5, further comprising an underfill material between the substrate and the interposer and an underfill material between the interposer and the integrated circuit die.

7. The integrated circuit assembly of claim 1, further comprising an adhesive material along an outer edge of the integrated circuit die to couple the integrated circuit die to the substrate.

8. The integrated circuit assembly of claim 1, wherein the integrated circuit die is a first integrated circuit die, the integrated circuit assembly further comprises a second integrated circuit die and bridge circuitry within the substrate to interconnect the first integrated circuit die and the second integrated circuit die.

9. The integrated circuit assembly of claim 1, wherein the metal pillars of the integrated circuit die comprise one or more of Copper, Nickel, Gallium, Oxygen, Silver, Platinum, Gold, Titanium, and Tungsten.

10. The integrated circuit assembly of claim 1, wherein the liquid metal is an alloy comprising Gallium and one or more of Indium, Tin, Zinc, and Oxygen.

11. A multi-die integrated circuit assembly comprising:
a first integrated circuit die comprising electrical connectors on a top side of the integrated circuit die; and
a second integrated circuit die coupled to the top side of the first integrated circuit die, the second integrated circuit die comprising metal pillars extending from a bottom side of the second integrated circuit die facing the top side of the first integrated circuit die;
wherein the metal pillars of the second integrated circuit die are electrically connected to the electrical connectors of the first integrated circuit die via a liquid metal.

12. The multi-die integrated circuit assembly of claim 11, where the first integrated circuit die comprises a plurality of wells defined on the top side of the first integrated circuit die and the metal pillars of the second integrated circuit die are disposed at least partially within the wells.

13. The multi-die integrated circuit assembly of claim 11, further comprising an underfill material between the first integrated circuit die and the second integrated circuit die.

14. The multi-die integrated circuit assembly of claim 11, wherein the electrical connectors of the first integrated circuit die include a plurality of metal pillars extending from the top side of the first integrated circuit die.

15. The multi-die integrated circuit assembly of claim 14, further comprising an interposer between the first integrated circuit die and the second integrated circuit die, the interposer defining a plurality of holes in which the metal pillars of the first integrated circuit die and the metal pillars of the second integrated circuit die are disposed.

16. The multi-die integrated circuit assembly of claim 15, further comprising an underfill material between the first integrated circuit die and the interposer and an underfill material between the interposer and the second integrated circuit die.

17. The multi-die integrated circuit assembly of claim 11, further comprising a substrate, wherein the first integrated circuit die is coupled to a top side of the substrate.

18. The multi-die integrated circuit assembly of claim 17, wherein the first integrated circuit die comprises metal pillars extending from a bottom side of the first integrated circuit die, the metal pillars of the first integrated circuit die electrically connected to the substrate via a liquid metal.

19. The multi-die integrated circuit assembly of claim 18, further comprising an interposer between the substrate and the first integrated circuit die, the interposer defining a plurality of holes in which the metal pillars of the first integrated circuit die are disposed.

20. The multi-die integrated circuit assembly of claim 11, wherein the metal pillars of the integrated circuit die comprise one or more of Copper, Nickel, Gallium, Oxygen, Silver, Platinum, Gold, Titanium, and Tungsten.

21. The multi-die integrated circuit assembly of claim 11, wherein the liquid metal is an alloy comprising Gallium and one or more of Indium, Tin, Zinc, and Oxygen.

22. A system comprising:
a main circuit board;
an integrated circuit assembly coupled to the main circuit board and comprising:
a substrate comprising electrical connectors on a top side of the substrate; and
an integrated circuit die coupled to the top side of the substrate, the integrated circuit die comprising metal pillars extending from a bottom side of the die facing the top side of the substrate;
wherein the metal pillars of the integrated circuit die are electrically connected to the electrical connectors of the substrate via a liquid metal.

23. The system of claim 22, wherein:
the integrated circuit die is a first integrated circuit die and the integrated circuit assembly further comprises a second integrated circuit die coupled to the substrate;

the substrate comprises bridge circuitry to interconnect the first integrated circuit die and the second integrated circuit die; and the second integrated circuit die comprises metal pillars that are electrically connected to electrical connectors of the substrate via a liquid metal.

24. The system of claim 22, the integrated circuit die is a first integrated circuit die and the integrated circuit assembly further comprises a second integrated circuit die coupled to a top side of the first integrated circuit die opposite the substrate, wherein the second integrated circuit die comprises metal pillars that are electrically connected to electrical connectors on the top side of the first integrated circuit die via a liquid metal.

25. The system of claim 22, wherein:

the metal pillars of the integrated circuit die comprise one or more of Copper, Nickel, Gallium, Oxygen, Silver, Platinum, Gold, Titanium, and Tungsten; and the liquid metal is an alloy comprising Gallium and one or more of Indium, Tin, Zinc, and Oxygen.

* * * * *